United States Patent Office 3,789,023

Patented Jan. 29, 1974

3,789,023

LIQUID DIFFUSION DOPANT SOURCE FOR SEMICONDUCTORS

Kim Ritchie, Phoenix, Ariz., assignor to Motorola, Inc., Franklin Park, Ill.

No Drawing. Continuation-in-part of application Ser. No. 130,772, Apr. 2, 1971. This application Aug. 9, 1972, Ser. No. 278,896

Int. Cl. C09k *3/00;* H05b *33/00;* H01b *1/06*

U.S. Cl. 252—518 8 Claims

ABSTRACT OF THE DISCLOSURE

There is disclosed a liquid diffusion dopant source for semiconductor diffusions which comprises in combination 54–64% ethyl alcohol, 15–25% ethyl acetate, 7–17% tetraethylsilicate, 3–10% water and 0.1–10% of a doping atom source selected from the group consisting of the compounds of arsenic, phosphorus, boron, antimony, zinc, aluminum, platinum, gold and gallium. The liquid dopant source may be readily coated onto the semiconductor wafer either by painting, spraying or preferably spinning. After drying of the coating, diffusion of the dopant atoms into the wafer is readily conducted in a standard diffusion furnace.

BACKGROUND OF THE INVENTION

This application is a continuation-in-part of application Ser. No. 130,772 filed Apr. 2, 1971, now abandoned.

This invention relates to a diffusion dopant source and more particularly to a spin-on liquid diffusion source for semiconductor production.

A spin-on diffusion dopant source is a liquid which may be formed as a thin layer on a semiconductor wafer utilizing a standard photoresist spinner which source when heated, transforms into a glassy film. Liquid diffusion sources have been previously suggested as replacements for gas-phase diffusion sources since the early days of the semiconductor industry. These early suggestions met with mixed success because of the problems of surface damage, non-uniformity, shelf life, and other problems. Thus, it has been generally more customary to use gas-phase doping even though the gas-phase doping requires longer time cycles and extra heat treatment steps. It has been theoretically apparent that a liquid dopant source would provide more reproducibility, more economy, and higher yields than gas-phase doping. The major problem with previous liquid-phase doping has been the difficulty of achieving low sheet resistance without creating a great number of surface defects.

Accordingly, it is an object of the invention to provide an improved liquid diffusion dopant solution which will overcome the deficiencies of the prior art.

It is a further object of the invention to provide an improved liquid dopant solution which will enable sheet resistances of less than 10 ohms per square to be produced at junction depths of the order of a few microns with a minimum of surface damage.

SUMMARY OF THE INVENTION

In accordance with the invention, there is provided a method of formulating a liquid dopant source comprising the steps of mixing absolute ethyl alcohol of about 20% by weight and distilled deionized water of about 3% by weight with a dopant atom source compound such as an oxide or chloride of about 3% by weight. These three ingredients are refluxed until the reaction thereof is essentially complete. Generally this takes in the order of about one-half hour. Following filtering of the refluxed ingredients, another 39% by weight of absolute ethyl alcohol, about 3% by weight of glycerol, approximately 20% by weight of ethyl acetate, and approximately 12% by weight of tetraethylorthosilicate is added.

The above results in a liquid doping source comprising in combination by weight 59% absolute ethyl alcohol, 20% ethyl acetate, 12% tetraethylorthosilicate, and 3% each of water, glycerol, and a dopant atom source such as arsenic, phosphorus, boron, antimony, zinc, aluminum, platinum, gold or gallium.

COMPLETE DESCRIPTION

In preparing a semiconductor wafer, silicon for example, for doping from a liquid diffusion source the wafer is prepared by several well-known processes. If the doping is to extend over the entire surface of the wafer, one or more drops of the liquid dopant solution are disposed thereon and the wafer spun at relatively high speed in order to form a uniform film over the wafer surface. The dopant may be sprayed on rather than spun on if desired. If only a portion of the wafer is to be doped as for example, a buried layer is to be formed in parts of the surface of a wafer, the outline of the buried layer may be defined by standard photoresist techniques in an appropriate buried layer such as silicon dioxide covering the surface of the wafer. Thereafter, one or more drops of the liquid dopant solution is disposed in the area where the emitter or buried layer is to be formed and the wafer spun at high speed to form a uniform film in the desired area. The wafer is then dried at a pre-bake temperature of about 200° C. to ensure the elimination of the solvent and to form a partial glass. The pre-bake step may be eliminated since the resultant surface concentration has been found by experimentation to be about the same in either case. However, a pre-bake is preferred to prevent any inadvertent splattering of the film upon introduction into the diffusion furnace.

One factor which can effect the uniformity of the sheet resistance over the resultant diffusion is the spin speed and spinner acceleration. The wafer should be flooded with a minimum volume of solution to reduce the possibility of back-splash and a recommended speed for two-inch wafers is 4,000 r.p.m. for a duration of 10 to 15 seconds.

Following the spin-on and pre-bake the wafer may be disposed in a diffusion furnace at an appropriate temperature normally approximately 1,000° C. for sufficient period of time to yield the desired depth of diffused junction.

The spin-on liquid dopant source in accordance with the invention results in the following notable advantages:

(1) the surface concentraation is determined by the chemistry of the spin-on eliminating costly gas panels which require adjustments;

(2) uniformity across the wafer and from wafer to wafer is excellent;

(3) surface damage at high surface concentrations is minimized;

(4) the spin-on source may be patterned utilizing photoresist techniques followed by a cap film of pure spin-on glass enabling diffusions without the requirement of thick oxide masks;

(5) both N and P type diffusions can be made at the same time with patterned N and P type spin-on sources;

(6) arsenic and zinc diffusions can be achieved without the requirement of the expensive ampoule technique;

(7) arsenic emitters can be constructed without base push-ahead;

(8) passivation and passivation with gettering can be achieved;

(9) the spin-on films are very economic to produce and utilize.

In utilizing the above technique for forming an N+ emitter to achieve a surface concentration of $4\times10^{20}$ atoms per cc. and a junction depth of about 0.27 microns with the sheet resistance of 50 to 53 ohms per square, a liquid dopant solution utilizing arsenic pentoxide as the dopant atom compoud is applied as described when the resulting wafer is heated for approximately 70 minutes at 1,000° C. For a typical buried layer application, the solution formulated in the manner described may be applied to the buried layer area of a wafer and will achieve a junction having 5 to 6 ohms per square resistance at a 5 micron depth by heating it about 1,200° C. for 7 hours. In the event that an integrated circuit buried layer is desired, the solution may be appropriately diluted by the addition of methyl alcohol whereby a junction depth of about 5 microns and about 13 to 25 ohms per square sheet resistance is achieved. The percentage of ingredients in formulation for the above with respect to the diffusion of arsenic may now be described.

Three percent by weight arsenic pentoxide, 3% by weight distilled deionized water, and 20% by weight of absolute ethyl alcohol are refluxed together including a small amount of heat, if necessary, until a reaction between the ingredients has gone substantially to completion. Typically the reaction period may be about one-half hour. The resulting solution is filtered through ordinary ash-free filter paper at essentially room temperature. To the filtrate the following ingredients are added, in sequence:

absolute ethyl alcohol about 39% by weight;
glycerol about 3% by weight;
ethyl acetate about 20% by weight; and
tetraethylorthosilicate about 12% by weight.

The combination of all of the ingredients may be stirred and filtered through a fine membraneous fiber such as a 1.2 micron millipore filter.

The filtering following the reflux step is intended to remove any particulate material; for example, excess of $As_2O_5$ and similarly the final filtering step is intended to remove any remaining particulate material of whatever nature.

The percentage of each of the ingredients is not highly critical and may be varied within the range of about ±5% without altering the essential characteristics of the formulation.

The 3% or thereabouts of glycerol is used to control the viscosity of the solution so that it will be spread into a coherent film when spun over the surface of a semiconductor wafer. In some instances, depending upon the viscosity desired, the glycerol may be eliminated.

If low surface concentrations of the dopant are desired, the resulting solution after completion as described, may be diluted by the addition of appropriate portions of methyl alcohol. Absolute ethyl alcohol may, of course, be used but it is more expensive. In the integrated circuit case referred to above the dilution is on the basis of one part solution to one part methyl alcohol.

The solution, by appropriate dilution as described, will give it conductivity doping and surface concentration as low as $1\times10^{15}$ atoms per cc., as well as surface concentrations as high as $4\times10^{20}$ atoms per cc. for a lesser dilution.

The refluxing step as indicated should go until the reaction is essentially complete and it has been found that the reflux time was not less than about one-half hour and at the same time it was found that it need not be substantially longer. After refluxing, the reflux solution may be cooled to room temperature as will occur at least in part during the filtering operation. The formulation of the various ingredients should be carried out in a clean room in order to avoid any unnecessary contamination.

The following examples will be given with respect to only the surface concentrations obtained by way of experimentation. The process is substantially the same with respect to all solutions formed except for example the phosphorus solutions may be prepared by the use of a phosphorus hypochlorite in which case the reaction is extremely exothermic and requires no heat for refluxing.

Example 1.—The arsenic solution formulated as above in accordance with the invention results in a surface concentration range from $1.5\times10^{21}$ to $7.5\times10^{18}$. The diffusion ambient is preferably oxygen.

Example 2.—A phosphorus solution formulated in a similar manner resulted in a surface concentration of approximately $7\times10^{20}$ atoms per cc. The recommended furnace ambient is oxygen or nitrogen.

Example 3.—From an antimony solution manufactured similarly the normal concentration obtained was $4\times10^{19}$ atoms per cc. The recommended furnace ambient is preferably a mixture of nitrogen and oxygen.

Example 4.—Boron solutions resulted in a concentration range from $4.0\times10^{20}$ to $3\times10^{18}$.

Example 5.—A zinc solution formed a sheet resistance of 29 ohms per square for a 2.7 micron junction in $GaAs_{1-X}P_X$.

Example 6.—An aluminum solution resulted in a surface concentration of $1\times10^{17}$ atoms/cc.

All of the useful results were with no or minimal damage to the surface of the wafers.

What is claimed is:

1. The method of formulating a conductivity inducing doping solution comprising the steps of:

(a) providing the ingredients of 17 to 23% ethyl alcohol, 3 to 9% water and 0.1 to 10% of a doping atom source selected from the group consisting of the compounds of arsenic, phosphorus, boron, antimony, zinc, aluminum, platinum, gold and gallium;

(b) refluxing said ingredients of ethyl alcohol, water and doping atom source until the reaction thereof is essentially complete; and (c) adding to said refluxed ingredients 36 to 42% by weight ethyl alcohol, 0 to 6% by weight glycerol, 17 to 23% ethyl acetate and 9 to 15% by weight of tetraethylorthosilicate.

2. The method of claim 1 wherein the ingredients subsequent to refluxing are filtered.

3. The method of claim 1 wherein the refluxing of the ingredients is continued for about 30 minutes.

4. The method of claim 2 wherein the filtering is through ash-free filter paper.

5. The method of claim 2 including the steps of finally filtering the solution after all of the ingredients are added.

6. The method of claim 5 wherein the final filtering is through a millipore filter.

7. The method of claim 1 wherein said water is distilled and deionized before use.

8. A conductivity inducing doping solution for semiconductors produced by the method of claim 1.

References Cited

UNITED STATES PATENTS

| | | | |
|---|---|---|---|
| 3,476,621 | 11/1969 | Gittler | 148—186 XR |
| 3,514,348 | 5/1970 | Ku | 148—186 XR |
| 3,486,951 | 12/1964 | Norby | 148—186 XR |
| 3,557,026 | 1/1971 | Feeg et al. | 252—518 |

JOHN D. WELSH, Primary Examiner

U.S. Cl. X.R.

148—186; 252—182, 62.2